(12) United States Patent
Kim et al.

(10) Patent No.: US 7,186,301 B2
(45) Date of Patent: Mar. 6, 2007

(54) DEVICE AND METHOD FOR CLEANING PHOTOMASK

(75) Inventors: Yong Dae Kim, Chungcheongnam-do (KR); Jong Min Kim, Daejon (KR); Han Byul Kang, Gyeonggi-do (KR); Hyun Joon Cho, Gyeonggi-do (KR); Sang Soo Choi, Daejon (KR)

(73) Assignee: PKL Co., Ltd. (KR)

( * ) Notice: Subject to any disclaimer, the term of this patent is extended or adjusted under 35 U.S.C. 154(b) by 0 days.

(21) Appl. No.: 11/276,974

(22) Filed: Mar. 20, 2006

(65) Prior Publication Data

US 2006/0207633 A1    Sep. 21, 2006

(30) Foreign Application Priority Data

Mar. 21, 2005  (KR) .................. 10-2005-0023133
May 16, 2005  (KR) .................. 10-2005-0040498
Jul. 25, 2005  (KR) .................. 10-2005-0067185

(51) Int. Cl.
*B08B 3/00* (2006.01)

(52) U.S. Cl. .................. 134/26; 134/2; 134/3; 134/19; 134/27; 134/28; 134/29; 134/30; 134/34; 134/36; 134/41; 134/42

(58) Field of Classification Search .................. 134/26, 134/2, 3, 19, 27, 28, 29, 30, 34, 36, 41, 42
See application file for complete search history.

(56) References Cited

U.S. PATENT DOCUMENTS

| 6,071,376 | A  | * | 6/2000  | Nagamura et al. ..... 156/345.22 |
| 6,162,565 | A  | * | 12/2000 | Chao et al. .................... 430/5 |
| 6,209,553 | B1 | * | 4/2001  | Nagamura et al. ........ 134/56 R |
| 2002/0155360 | A1 | * | 10/2002 | Tange et al. .................. 430/5 |
| 2006/0137717 | A1 | * | 6/2006  | Lee ............................. 134/19 |
| 2006/0207633 | A1 | * | 9/2006  | Kim et al. .................... 134/28 |

* cited by examiner

*Primary Examiner*—Sharidan Carrillo
(74) *Attorney, Agent, or Firm*—Adam K Sacharoff; Much Shelist

(57) ABSTRACT

Disclosed herein is a device and a method of cleaning a photomask, which prevents haze from being generated on a surface of the photomask during a photolithography process. The photomask is heat treated to remove residual ions on a surface thereof and to induce curing and oxidation of Cr and MoSiON layers, thereby preventing diffusion of the ions. Etching of Cr and MoSiON layers due to a cleaning process is suppressed in order to significantly reduce a change in phase and transmissivity of optical properties of Cr and MoSiON.

11 Claims, 3 Drawing Sheets

DEVICE AND METHOD FOR CLEANING PHOTOMASK

BACKGROUND OF THE INVENTION

1. Field of the Invention

The present invention relates to a cleaning device and method. More particularly, the present invention pertains to a device and a method of cleaning a photomask that prevent haze from being generated on a surface of the photomask during a photolithography process.

2. Description of the Related Art

In accordance with increased integration of semiconductor devices, wavelengths of exposure sources are becoming shorter and shorter in order to improve the resolution of patterns. Accordingly, a haze, which is not formed in a conventional wavelength band, may occur. In a conventional photolithography process at a wavelength above an I-line, exposing energy is relatively low, thus a phenomenon in which residual ions, such as $SO_x$, $NO_x$, $PO_x$, F, Cl, $NH_4$, Ca, and Mg, on a surface of a photomask cause an optical reaction does not occur.

However, at a light source of 248 nm or less, exposing energy is increased as a wavelength is shortened. Therefore, an optical reaction occurs between the residual ions on the surface of the mask, and a growth defect called a haze is formed.

A conventional wet cleaning device and method is problematic in that it cannot completely remove such haze.

SUMMARY OF THE INVENTION

Accordingly, the present invention has been made keeping in mind the above problems occurring in the prior art, and an object of the present invention is to provide a device and a method of cleaning a photomask, in which heat treatment is conducted after a cleaning process in order to remove residual ions from the surface of the mask, and consequently, haze is prevented and optical property changes to a phase shift mask are reduced.

In order to accomplish the above object, the present invention provides a device for cleaning a photomask. The device comprises a first cleaning unit for cleaning the photomask using acids to remove a polymer formed on the photomask, a second cleaning unit for cleaning the photomask using bases, a heat treating unit for heat treating the photomask cleaned using the acids and bases, a cooling unit for cooling the heat treated high temperature photomask, and a robot arm for carrying the photomask.

Preferably, the heat treating unit is an electric heating furnace or a convection oven.

The present invention also provides a method of cleaning a photomask. The method comprises (a) conducting a first cleaning process using acids to remove a polymer formed on the photomask, (b) conducting a second cleaning process using heated hydrogen peroxide and ozone water, (c) conducting first heat treatment, (d) conducting a third cleaning process using bases, (e) conducting a fourth cleaning process using the heated hydrogen peroxide and ozone water, and (f) conducting second heat treatment.

Preferably, acidic residual ions and ions that react with ammonia are activated, and the surface of the mask is oxidized in step (c).

Preferably, ammonia is removed from the surface of the mask using a chemical reaction during the cleaning process using bases, and oxygen is applied on the surface of the mask in steps (b) and (e).

Preferably, ions that react with ammonia are activated, basic residual ions are vaporized, and the surface of the mask is oxidized in step (f).

Preferably, the method further comprises conducting a rinsing process using ultrapure water after step (a).

Preferably, step (a) is conducted using an aqueous solution including hydrogen peroxide mixed with one of a sulfuric acid, a nitric acid, or a phosphoric acid, and the ozone water.

Preferably, steps (b) and (e) are conducted at 40–100° Celsius.

Preferably, the heat treatment is conducted in a gas atmosphere which includes one or more selected from the group consisting of $N_2$, Ar, $O_2$, and He gases.

Preferably, step (d) is conducted using an aqueous solution (SC-1) including ammonia water and hydrogen peroxide mixed with each other, and hydrogen water.

Preferably, the heat treatment is conducted at 50–1000° Celsius for 5 min–5 hours.

Preferably, the heat treatment is conducted at 50–400° Celsius.

More preferably, the basic residual ions are ammonia ($NH_4$).

Furthermore, the present invention provides a method of cleaning a photomask. The method comprises (a') conducting a first cleaning process using acids, (b') conducting first heat treatment to activate acidic residual ions, (c') conducting a rinsing process using ultrapure water to remove the activated acidic residual ions, and (d') conducting a second cleaning process using bases.

Preferably, the method further comprises step (e') of conducting second heat treatment in order to vaporize basic residual ions after step (d').

Preferably, the rinsing process is conducted using the ultrapure water after the cleaning process and the heat treatment.

Preferably, step (a') is conducted using an aqueous solution including hydrogen peroxide mixed with one of a sulfuric acid, a nitric acid, or a phosphoric acid, and ozone water.

Preferably, the heat treatment is conducted in a gas atmosphere which includes one or more selected from a group consisting of $N_2$, Ar, $O_2$, and He gases.

Preferably, step (d') is conducted using an aqueous solution (SC-1) including ammonia water and hydrogen peroxide mixed with each other, and hydrogen water.

Preferably, the heat treatment is conducted at 50–1000° Celsius for 5 min–5 hours.

Preferably, the heat treatment is conducted at 50–400° Celsius.

More preferably, the basic residual ions are ammonia ($NH_4$) ions.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, a detailed description will be given of the present invention, referring to the accompanying drawings.

Figure 1:
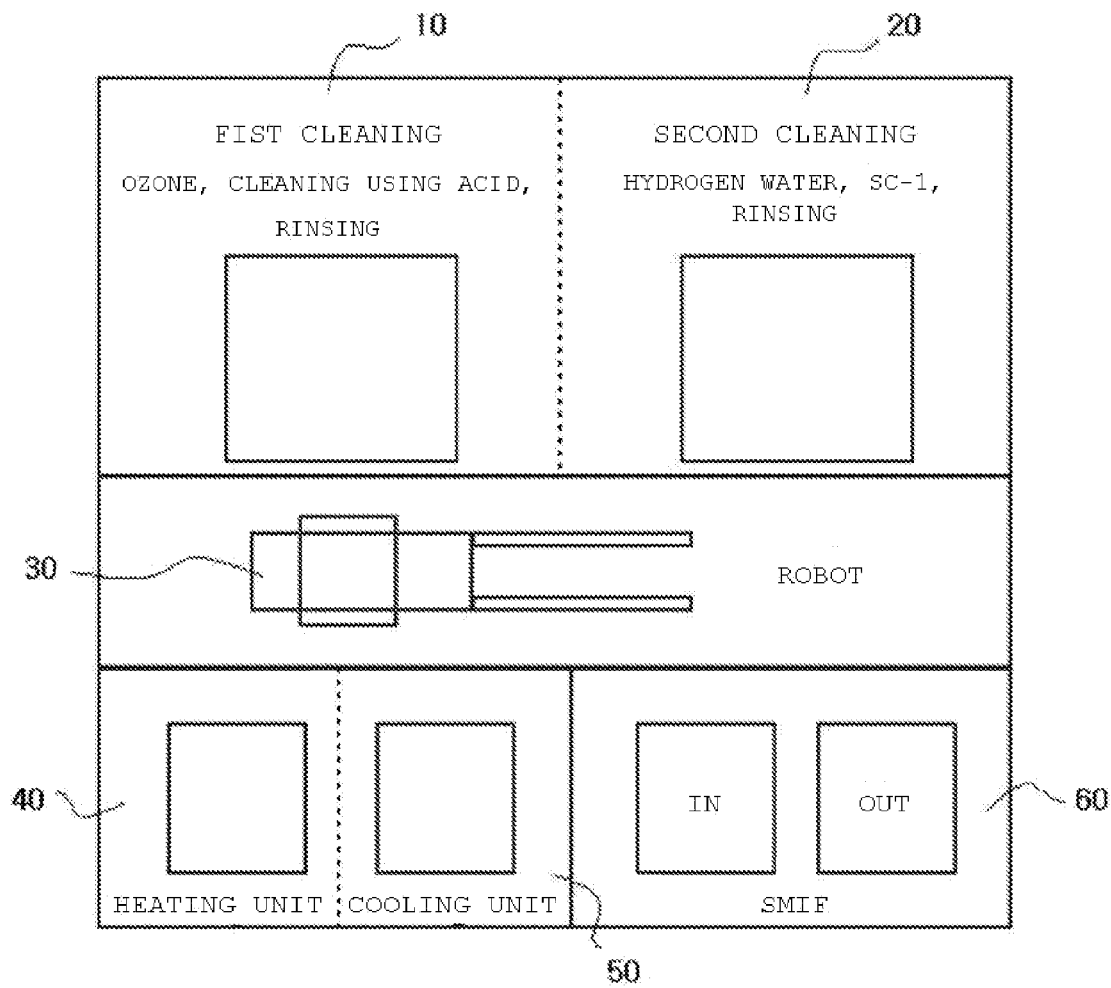
FIG. 1 illustrates a device for cleaning a photomask according to the present invention.

FIG. 1 illustrates a device for cleaning a photomask according to the present invention.

As shown in FIG. 1, the device for cleaning a photomask according to the present invention comprises a first cleaning unit 10, a second cleaning unit 20, a robot arm 30, a heat treating unit 40, a cooling unit 50, and a photomask carrier 60.

The first cleaning unit 10 cleans the photomask using acids to remove a polymer formed on the photomask.

Furthermore, the second cleaning unit 20 cleans the photomask using bases.

As well, the robot arm 30 carries the photomask.

Additionally, the heat treating unit 40 heat treats the photomask, which was cleaned using the acids and bases.

In the present embodiment, illustrative, but, non-limiting, examples of the heat treating unit include an electric heating furnace and a convection oven.

Additionally, the cooling unit 50 cools the heat treated high temperature photomask.

Further, the photomask carrier 60 stores and carries the photomask.

Hereinafter, a description will be given of a method of cleaning the photomask using the device for cleaning the photomask according to the present invention.

A method of cleaning a photomask according to an embodiment of the present invention will be described, referring to FIG. 2.

Figure 2:
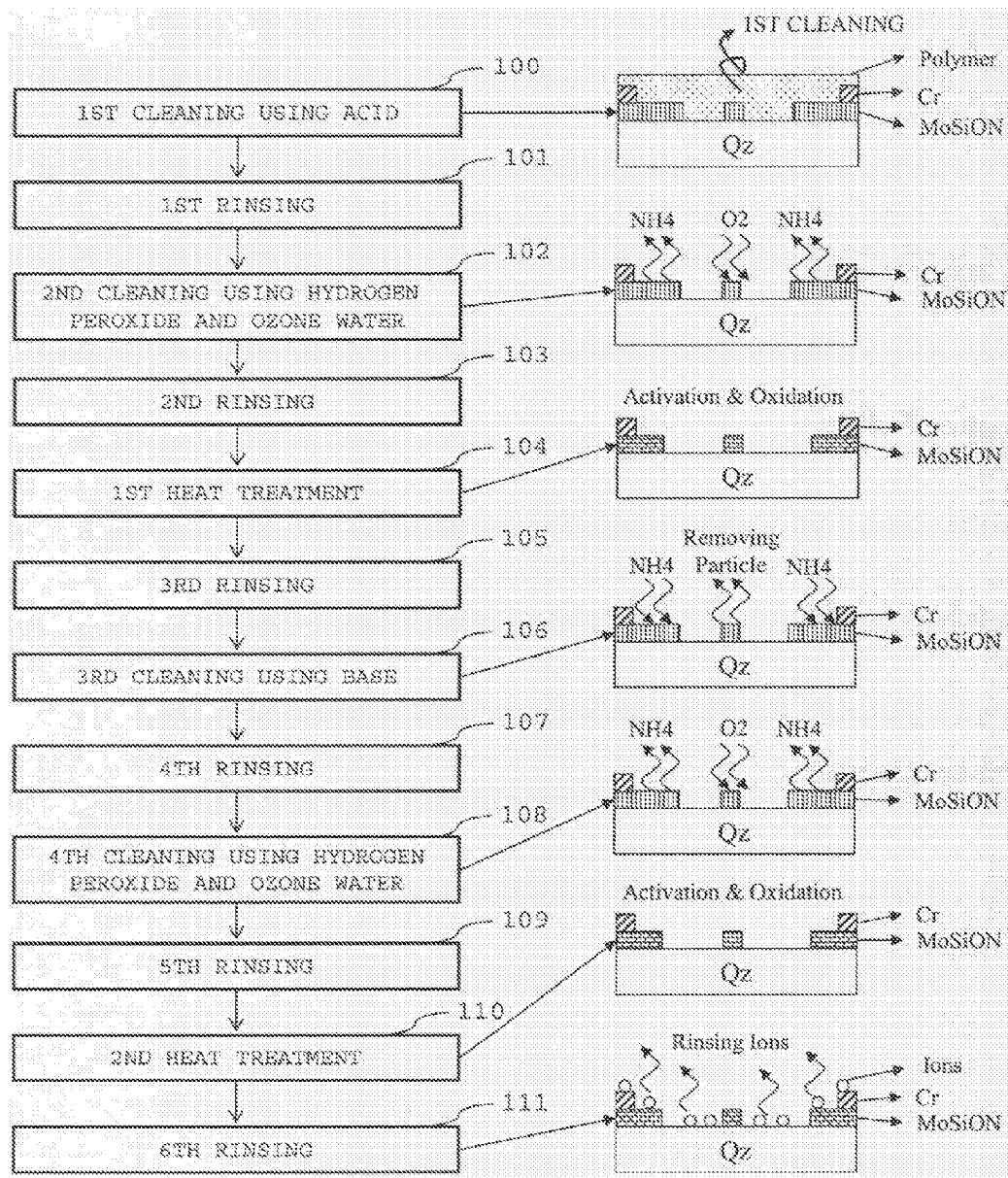
FIG. 2 is a flowchart showing a process of cleaning a photomask according to an embodiment of the present invention.

FIG. 2 is a flowchart showing a process of cleaning a photomask according to an embodiment of the present invention.

As shown in FIG. 2, a polymer formed on the photomask is removed using an aqueous solution, including hydrogen peroxide mixed with an acid, such as a sulfuric acid ($H_2SO_4$), a nitric acid ($HNO_3$), or a phosphoric acid ($H_3PO_4$), and ozone water, in order to conduct a first cleaning process 100. Next, a first rinsing process 101 is conducted using ultrapure water at 50° Celsius or higher.

Subsequently, ammonia is removed from a surface and an inside of the mask using hydrogen peroxide and ozone water heated at 40–100° Celsius to conduct a second cleaning process 102. Oxygen is then applied to the surface of the mask. Subsequently, a second rinsing process 103 is conducted using ultrapure water at 50° Celsius or higher.

First heat treatment 104 is then conducted in a gas atmosphere which includes one or more selected from $N_2$, $O_2$, Ar, and He in the electric heating furnace at 50–1000° Celsius for 5 min–5 hours. Due to the first heat treatment, ions that react with ammonia in the second cleaning process 102 and acid-based residual ions, such as $SO_x$, $NO_x$, and $PO_x$, are activated, and the surface of the mask is oxidized. Accordingly, ammonia cannot permeate through the surface of the mask during a cleaning process that uses tertiary bases.

Subsequently, the residual ions activated by the first heat treatment 104 are removed by a third rinsing process 105. In the third rinsing process, ultrapure water at 50° Celsius or higher is used.

Next, a third cleaning process 106 is conducted using an aqueous solution (SC-1) including ammonia water as a base and hydrogen peroxide mixed with each other and hydrogen water. A fourth rinsing process 107 is then conducted using ultrapure water at 50° Celsius or higher.

Subsequently, a fourth cleaning process 108 is conducted using hydrogen peroxide and ozone water heated at 40–100° Celsius. As a result, during the third cleaning process 106 using the tertiary base, ammonia is removed from the surface and the inside of the mask. Next, oxygen is applied on the surface of the mask. Subsequently, a fifth rinsing process 109 is conducted using ultrapure water at 50° Celsius or higher.

Subsequently, second heat treatment 110 is conducted in a gas atmosphere which includes one or more selected from $N_2$, Ar, $O_2$, and He gases in the electric heating furnace at 50–1000° Celsius for 5 min–5 hours. Due to the second heat treatment, ions which remain on the surface of the photomask and that react with ammonia in the fourth cleaning process 108 are activated. Additionally, ammonia ($NH_4$) as a basic residual ion is vaporized to oxidize the surface of the mask. The first and second heat treatments may be conducted in a convection oven, and it is preferable that the heat treating temperature be 50–400° Celsius.

Finally, a sixth rinsing process 111 is conducted using ultrapure water at 50° Celsius or higher.

A method of cleaning a photomask according to another embodiment of the present invention will be described with reference to FIG. 3.

Figure 3:
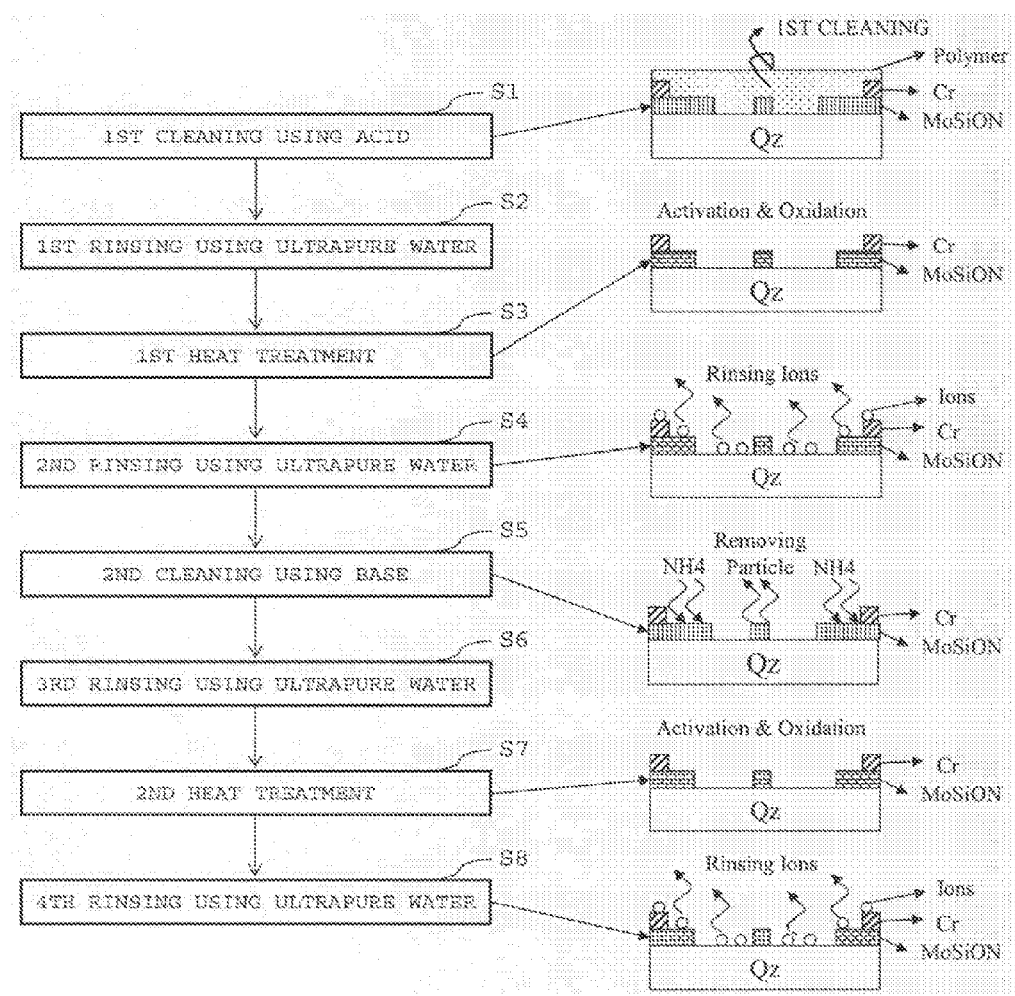
FIG. 3 is a flowchart showing a process of cleaning a photomask according to another embodiment of the present invention.

FIG. 3 is a flowchart showing a process of cleaning a photomask according to another embodiment of the present invention.

As shown in FIG. 3, a polymer formed on the photomask is removed using an aqueous solution including acids, such as hydrogen peroxide mixed with a sulfuric acid ($H_2SO_4$), a nitric acid ($HNO_3$), or a phosphoric acid ($H_3PO_4$), and ozone water in order to conduct a first cleaning process (S1). Next, a first rinsing process (S2) is conducted using ultrapure water at 50° Celsius or higher.

Subsequently, in order to activate the acidic residual ions, such as $SO_x$, $NO_x$, and $PO_x$, first heat treatment (S3) is conducted in a gas atmosphere which includes one or more selected from $N_2$, $O_2$, Ar, and He in an electric heating furnace at 50–1000° Celsius for 5min–5 hours.

To remove the residual ions activated by the first heat treatment, a second rinsing process (S4) is conducted using ultrapure water at 50° Celsius or higher.

Next, a second cleaning process (S5) is conducted using an aqueous solution (SC-1) including ammonia water as a base and hydrogen peroxide mixed with each other and hydrogen water. A third rinsing process (S6) is then conducted using ultrapure water at 50° Celsius or higher.

Subsequently, in order to vaporize ammonia ($NH_4$) as the basic residual ion remaining on the surface of the photomask, second heat treatment (S7) is conducted in a gas atmosphere which includes one or more selected from $N_2$, Ar, $O_2$, and He gases in an electric heating furnace at 50–1000° Celsius for 5 min–5 hours. The first and second heat treatments may be conducted in a convection oven, and it is preferable that the heat treating temperature be 50–400° Celsius.

Finally, a fourth rinsing process (S8) is conducted using ultrapure water at 50° Celsius or higher.

In the present invention, when the heat treatment is conducted using oxygen ($O_2$) gas, ammonia ($NH_4$) ions present on the surface of the photomask are dissociated by heat at an early step in the heat treatment, thus being desorbed from the photomask. During the heat treatment, a phase change of Cr and blocking (MoSiON) films is prevented. Furthermore, due to oxidation, the ammonia ($NH_4$) ions remaining on the photomask cannot be diffused outside during exposure of a wafer, and the residual ions are activated. Due to a phase change and oxidation of the MoSiON layer, the ammonia ($NH_4$) ions included in the SC-1 do not diffuse into the Cr and MoSiON layers during a cleaning process using bases.

If the heat treatment is conducted using $N_2$ gas, the change in phase and transmissivity of optical properties of the MoSiON layer is controlled by nitrification (MoSiN) of MoSi. Additionally, acidic residual ions are activated and the ammonia ions are vaporized. As well, if Ar or He gas is used, the residual ions on the surface of the mask are activated and the ammonia ions are vaporized without oxidation or nitrification of MoSiON.

As described above, the present invention provides a device and a method for cleaning a photomask, in which the photomask is heat treated to remove residual ions on a surface thereof and to induce curing and oxidation of Cr and MoSiON layers, thereby diffusion of the ions is prevented.

Additionally, the present invention provides a device and a method of cleaning a photomask, in which etching of Cr and MoSiON layers due to a cleaning process is suppressed so as to significantly reduce a change in phase and transmissivity of the optical properties of Cr and MoSiON.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of cleaning a photomask, comprising:
   (a) conducting a first cleaning using an aqueous solution containing an acid in order to remove a polymer formed on the photomask, said acid selected from the group consisting of sulfuric acid, phosphoric acid, and nitric acid;
   (b) conducting a second cleaning on the photomask using heated hydrogen peroxide and ozone water;
   (c) conducting a first heat treatment by heating the photomask;
   (d) conducting a third cleaning on the photomask with an aqueous solution of ammonia and hydrogen peroxide;
   (e) conducting a fourth cleaning on the photomask using the heated hydrogen peroxide and ozone water; and (f) conducting a second heat treatment by heating the photomask.

2. The method as set forth in claim 1, wherein a surface of the photomask is oxidized in step (c).

3. The method as set forth in claim 1, wherein oxygen is applied on the surface of the photomask in steps (b) and (e).

4. The method as set forth in claim 1, wherein a surface of the photomask is oxidized in step (f).

5. The method as set forth in claim 1, further comprising conducting a rinsing process using ultrapure water after step (a).

6. The method as set forth in claim 1, wherein the aqueous solution of step (a) further comprises hydrogen peroxide and ozone.

7. The method as set forth in claim 1, wherein steps (b) and (e) are conducted at 40–100° Celsius.

8. The method as set forth in claim 1 wherein the heat treatment is conducted in a gas atmosphere which includes one or more gases selected from a group consisting of $N_2$, Ar, $O_2$, and He.

9. The method as set forth in claim 1, wherein the heat treatment is conducted at 50–1000° Celsius for 5 min–5 hours.

10. The method as set forth in claim 1, wherein the heat treatment is conducted at 50–400° Celsius.

11. The method as set forth in claim 4, wherein ammonia ($NH_4$) is vaporized in step (f).

* * * * *